(12) United States Patent
Tang et al.

(10) Patent No.: US 8,910,009 B1
(45) Date of Patent: Dec. 9, 2014

(54) METHOD AND APPARATUS FOR ENHANCING ERROR DETECTION IN DATA TRANSMISSION

(75) Inventors: Heng Tang, Sunnyvale, CA (US); Zaihe Yu, Santa Clara, CA (US); Gregory Burd, San Jose, CA (US); Panu Chaichanavong, Mountain View, CA (US)

(73) Assignee: Marvell International Ltd., Hamilton (BM)

( * ) Notice: Subject to any disclaimer, the term of this patent is extended or adjusted under 35 U.S.C. 154(b) by 1262 days.

(21) Appl. No.: 12/553,049

(22) Filed: Sep. 2, 2009

Related U.S. Application Data (60) Provisional application No. 61/095,136, filed on Sep. 8, 2008.

(51) Int. Cl.
  *H03M 13/00* (2006.01)
(52) U.S. Cl.
  USPC ......................................................... 714/752
(58) Field of Classification Search
  CPC . H04L 1/0057; H04L 1/0041; H03M 13/116; H03M 13/1111; H03M 13/1137
  USPC ......................................................... 714/752
  See application file for complete search history.

(56) References Cited

U.S. PATENT DOCUMENTS

| | | | | |
|---|---|---|---|---|
| 4,993,029 A * | 2/1991 | Galbraith et al. | ............. | 714/769 |
| 5,359,468 A * | 10/1994 | Rhodes et al. | .................. | 360/48 |
| 5,600,662 A * | 2/1997 | Zook | .............................. | 714/769 |
| 6,112,324 A * | 8/2000 | Howe et al. | .................... | 714/763 |
| 6,185,173 B1 * | 2/2001 | Livingston et al. | ......... | 369/59.21 |
| 6,198,705 B1 * | 3/2001 | Tran et al. | ................... | 369/32.01 |
| 6,397,366 B1 * | 5/2002 | Tanaka et al. | ................. | 714/769 |
| 7,120,849 B2 * | 10/2006 | Hwang et al. | ................. | 714/752 |
| 7,134,068 B2 * | 11/2006 | Silvus et al. | ................... | 714/798 |
| 7,734,977 B2 * | 6/2010 | Ornes et al. | ................... | 714/746 |
| 7,783,950 B2 * | 8/2010 | Esumi et al. | ................... | 714/752 |
| 2002/0026615 A1 * | 2/2002 | Hewitt et al. | ................. | 714/752 |
| 2003/0122964 A1 * | 7/2003 | Hara | .............................. | 348/515 |
| 2006/0146680 A1 * | 7/2006 | MacDonald et al. | ......... | 369/100 |
| 2008/0267323 A1 * | 10/2008 | Bliss et al. | ..................... | 375/341 |
| 2009/0231985 A1 * | 9/2009 | Senshu | ....................... | 369/275.3 |

* cited by examiner

*Primary Examiner* — Albert Decady
*Assistant Examiner* — Enam Ahmed (57) ABSTRACT

A transceiver includes a transmitter and a receiver. The transmitter includes an ECC encoder and a data frame generator. The ECC encoder is configured to generate an ECC parity from user data and at least one bit from a syncmark. The data frame generator is configured to generate a data frame for transmission from the syncmark, the user data, and the ECC parity. The receiver includes a detector, an inverter, and a decoder. The detector is configured to detect a received syncmark in a received data frame. The received data frame includes the received syncmark, received user data, and received ECC parity. The inverter is configured to selectively invert a sequence. The sequence includes the received user data, the received ECC parity, and at least one bit from the received syncmark. The decoder is configured to decode one of the sequence or the inverted sequence.

17 Claims, 11 Drawing Sheets

| b | ECC encoder input | ECC encoder output | Data used to generate transmitted waveform |
|---|---|---|---|
| 0 | 1, DATA | 1, DATA, ECC parity bits | Preamble, Syncmark, $\overline{\text{DATA}}$, $\overline{\text{ECC parity bits}}$ |
| 1 | 1, DATA | 1, DATA, ECC parity bits | Preamble, Syncmark, DATA, ECC parity bits |

FIG. 7

| b | CTRL | Data detector output | Input to ECC decoder |
|---|---|---|---|
| 0 | 0 | $\widehat{b}$, DATA, ECC parity bits | $\widehat{b}$, DATA, ECC parity bits |
| 0 | 1 | $\widehat{b}$, DATA, ECC parity bits | 1, DATA, ECC parity bits |
| 1 | 0 | $\widehat{b}$, DATA, ECC parity bits | $\widehat{b}$, DATA, ECC parity bits |
| 1 | 1 | $\widehat{b}$, DATA, ECC parity bits | 1, DATA, ECC parity bits |

METHOD AND APPARATUS FOR ENHANCING ERROR DETECTION IN DATA TRANSMISSION

CROSS REFERENCE TO RELATED APPLICATION

This application claims the benefit of priority to previously filed U.S. provisional patent application Ser. No. 61/095,136, filed Sep. 8, 2008, entitled ENHANCING ERROR DETECTION BY ENCODING LSB OF SYNCMARK IN ERROR CORRECTING CODE. That provisional application is hereby incorporated by reference in its entirety.

BACKGROUND

1. Field of the Invention

The present invention relates generally to data transmission, and more particularly to error detection in data transmission.

2. Description of Related Art

Figure 1:
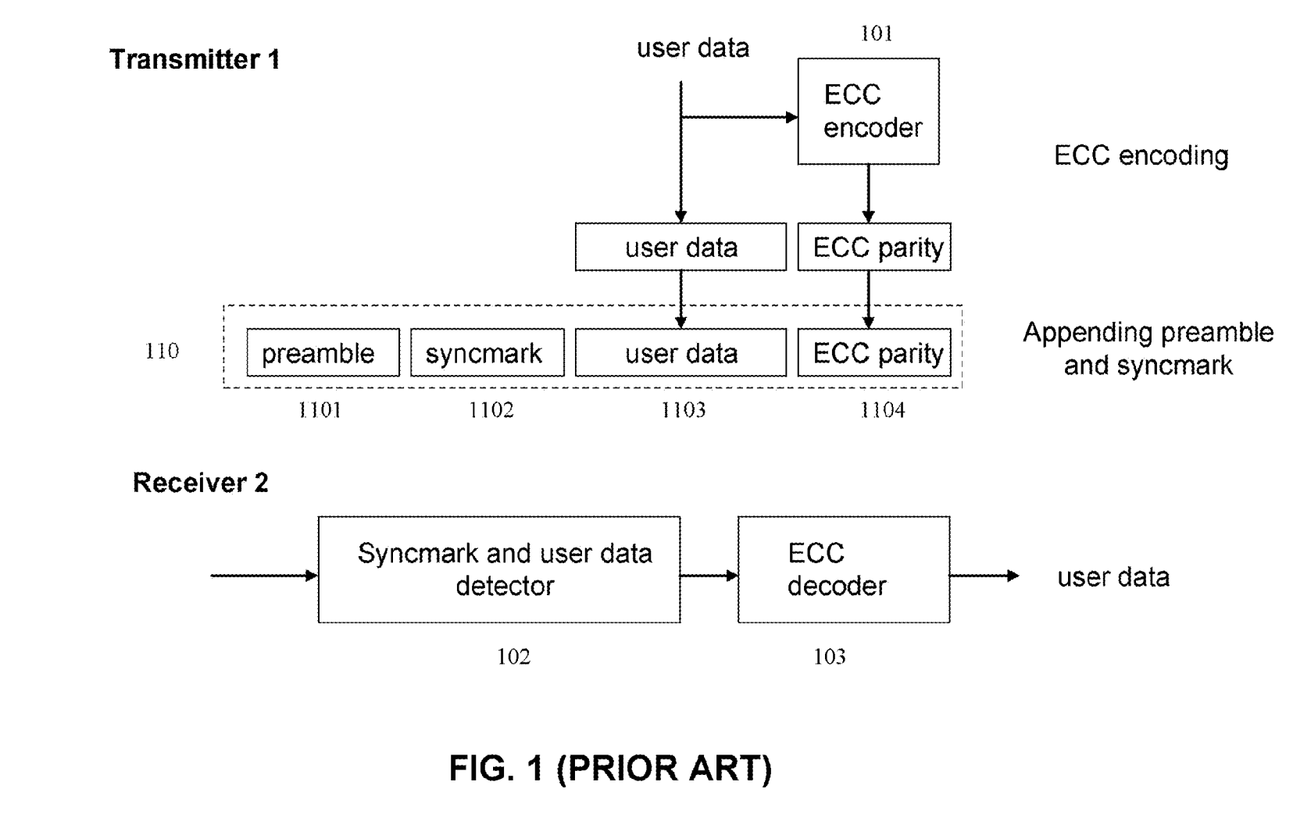
FIG. 1 illustrates a prior art data frame structure and a process of data transmission.

FIG. 1 illustrates a prior art data frame structure and a data transmission process. At a transmitter 1, a data frame 110 may start with a preamble field 1101, which is followed in sequence by a syncmark field 1102, a user data field 1103 (also referred to as payload), and an error correcting code (ECC) parity field 1104. The syncmark may be a unique series of 0 and 1 and may be used to identify, preferably with high reliability, the start of user data to be transmitted. Since the user data field is immediately after the syncmark, as long as the syncmark is detected, the start of user data will be located. The ECC parity may be generated by an ECC encoder 101 from the user data.

A receiver 2 may be informed of the syncmark in advance, and may detect the start of user data by searching for the syncmark. At the receiver 2, a data frame from the transmitter 1 may first enter a syncmark and user data detector 102. If the syncmark is not found, the receiver 2 may claim failure and report error status. If the syncmark is found, the received bits corresponding to the user data 1103 and ECC parity 1104 may be fed from the syncmark and user data detector 102 to an ECC decoder 103. The ECC decoder 103 may try to decode and/or correct errors in its input. When there is no error, or there are errors but the errors are correctable, the ECC decoder 103 may output decoded user data. Otherwise, the ECC decoder 103 may claim failure and report error status.

The error detection capability of an ECC mainly depends on the number of bits in the ECC parity. The more bits in the ECC parity, the more errors the ECC may detect and/or correct. Thus, one known solution to enhance the error detection capability of an ECC is to use an ECC parity which is sufficiently long. However, when the physical space for a data frame is fixed, a long ECC parity may lead to higher bit density, which in turn may degrade the performance of the ECC. Therefore, it may be desirable to provide a method and apparatus that improve error correction capability of the ECC without costing data bit density.

SUMMARY

A method for detecting errors in data transmission comprises, at a transmitter, generating an error correcting code (ECC) parity from user data and at least one bit from a syncmark; forming a data frame with the syncmark, the user data and the ECC parity; and transmitting the data frame.

A transmitter comprises: an ECC encoder for generating an ECC parity from user data and at least one bit from a syncmark.

A receiver comprises: a detector for detecting a syncmark in a received data frame comprising the syncmark, user data and an ECC parity generated from the user data and at least one bit from the syncmark; and a decoder for decoding the user data.

BRIEF DESCRIPTION OF THE DRAWING FIGURES

Embodiments of the present invention are described herein with reference to the accompanying drawings, similar reference numbers being used to indicate functionally similar elements.

DETAILED DESCRIPTION

To enhance the error detection capability of a given ECC without changing data bit density, the present invention includes one or more bits from the syncmark, e.g., the least significant bit (LSB) of the syncmark, in ECC encoding and decoding. The invention may be implemented in hardware, firmware, software or a combination thereof.

Figure 2:
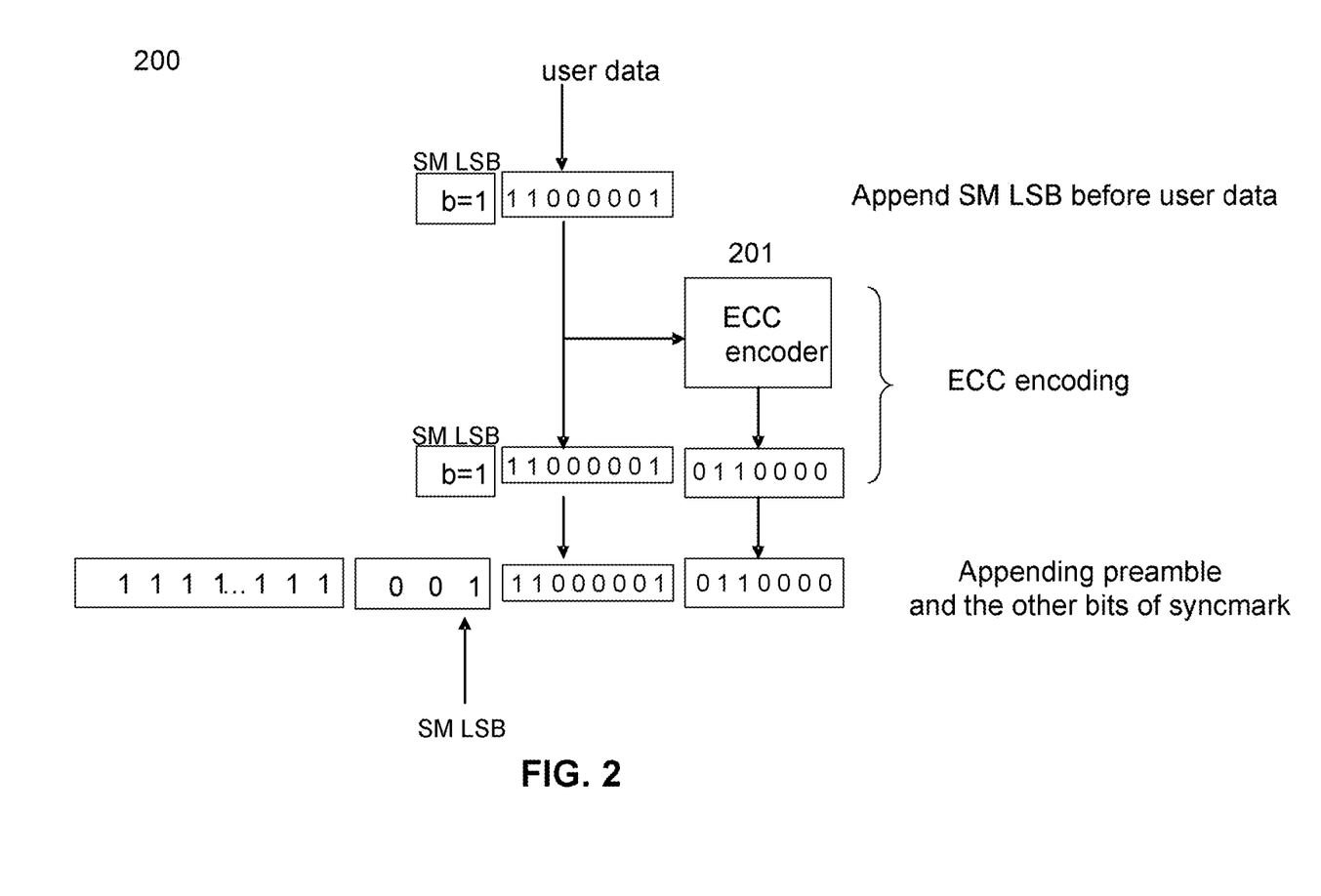
FIG. 2 illustrates a diagram of a transmitter according to one embodiment of the present invention.

FIG. 2 illustrates a diagram of a transmitter according to one embodiment of the present invention. In the embodiment of FIG. 2, the user data to be transmitted may be "11000001", the syncmark may be "001", and the preamble may be "1111 . . . 111". In addition to the user data, the input to an ECC encoder 201 of a transmitter 200 may also include one or more bits from the syncmark. In the embodiment shown, the LSB of the syncmark, which is "1", may be selected, although other bit(s) in the syncmark may be selected as well. In one embodiment, the bit from the syncmark may be appended before the user data.

The ECC encoder 201 may generate a 7-bit ECC parity which is able to correct 1-bit error. In the embodiment shown, the ECC parity generated may be, e.g., "0110000".

As shown in FIG. 2, the data frame to be transmitted may start with the preamble "1111 . . . 111", which may be followed by the syncmark "001", the user data "11000001" and the ECC parity "0110000" in sequence. Since the input to the ECC encoder 201 is one bit longer than it otherwise would be, the error detection capability may be enhanced. Meanwhile, since the bit added to the input of the ECC encoder 201 is selected from the syncmark, which is already a part of the data frame to be transmitted, the bit density of the data frame is not affected.

Figure 3A:
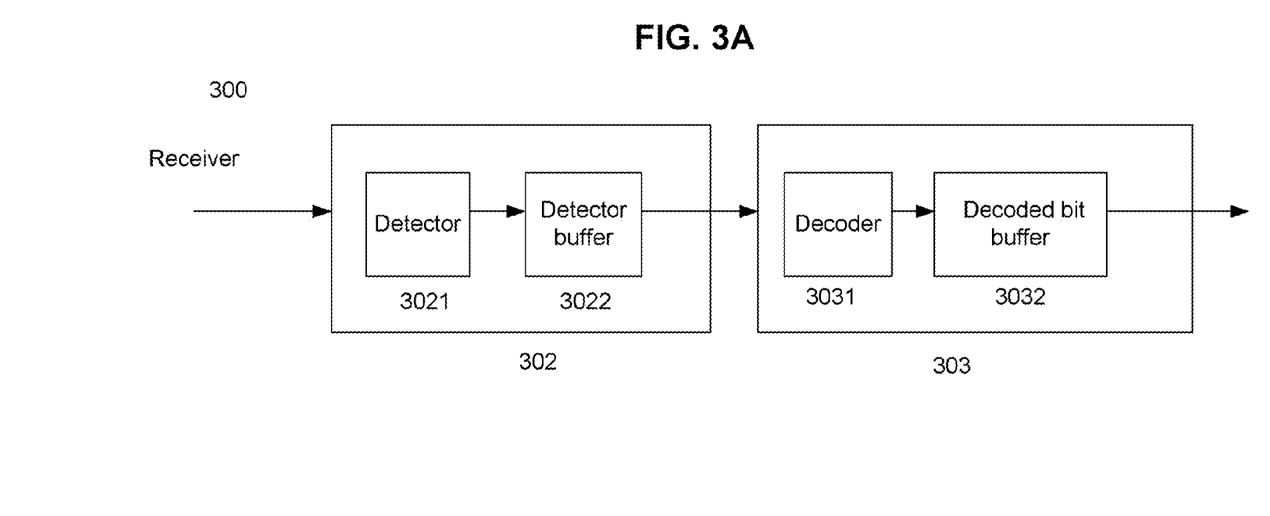
FIG. 3A illustrates a diagram of a receiver according to one embodiment of the present invention.

FIG. 3A illustrates a diagram of a receiver according to one embodiment of the present invention. A receiver 300 may have a syncmark and user data detector 302 and an ECC decoder 303. The syncmark and user data detector 302 may include a detector 3021) and a detector buffer 3022, and the ECC decoder 303 may include a decoder 3031, and a decoded bit buffer 3032. The detector 3021 may be based on a hard decision or soft decision, which may minimize the Hamming distance or Euclidean distance between the syncmark and the received sequence in the detection window, respectively.

Figure 3B:
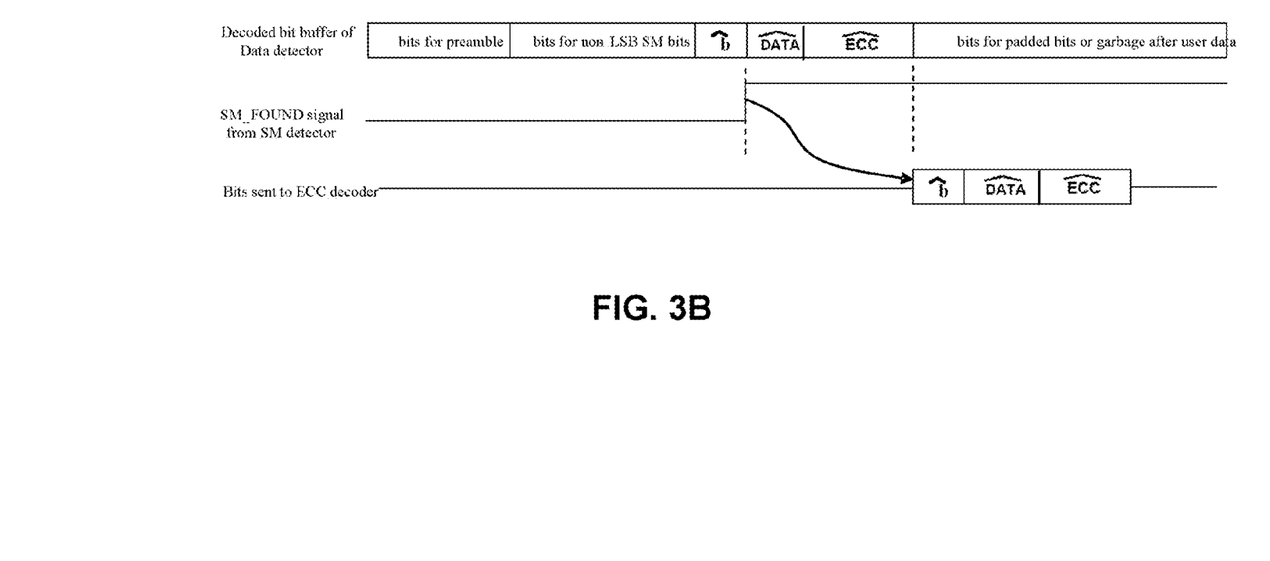
FIG. 3B illustrates exemplary data sequences in a syncmark and data detector in the receiver of FIG. 3A according to one embodiment of the present invention.

A data frame from the transmitter 200 may first enter the detector 3021 and the data start location may be detected by searching for the syncmark. If the detector 3021 determines that the syncmark is found, it may store the received data frame in the data detector buffer 3022. As shown in FIG. 3B, the stored data frame may have: the received preamble, the received syncmark (including the non-LSB bit(s) and the LSB $\widehat{b}$), the received user data $\widehat{DATA}$, the received ECC parity $\widehat{ECC}$, and padded bits or garbage after user data. A SM_FOUND signal may turn high right before the user data, indicating the start position of the received user data. The syncmark and user data detector 302 may send the LSB $\widehat{b}$ of the syncmark, received user data $\widehat{DATA}$, and the received ECC parity $\widehat{ECC}$ to the ECC decoder 303 for decoding.

Figure 3C:
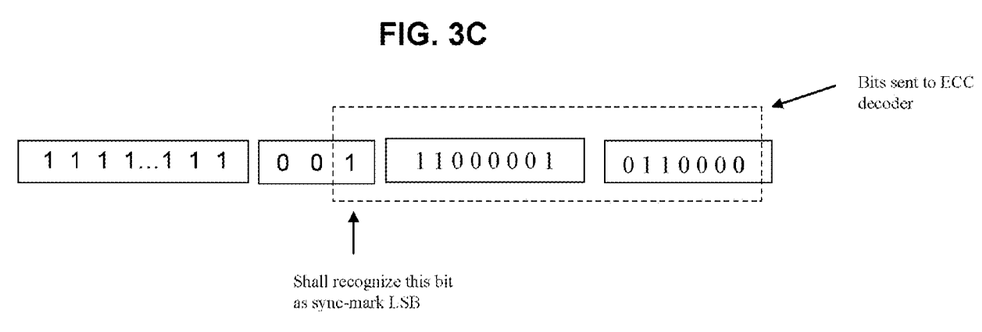
FIG. 3C illustrates an exemplary output of a syncmark and data detector in the receiver of FIG. 3A when the syncmark is correctly detected.

When there are no transmission errors, the detector 3021 may find the syncmark at the correct position, and thus the bits sent to the ECC decoder 303 may be the syncmark LSB "1", the user data "11000001" and the ECC parity "0110000", as shown in FIG. 3C.

Figure 3D:
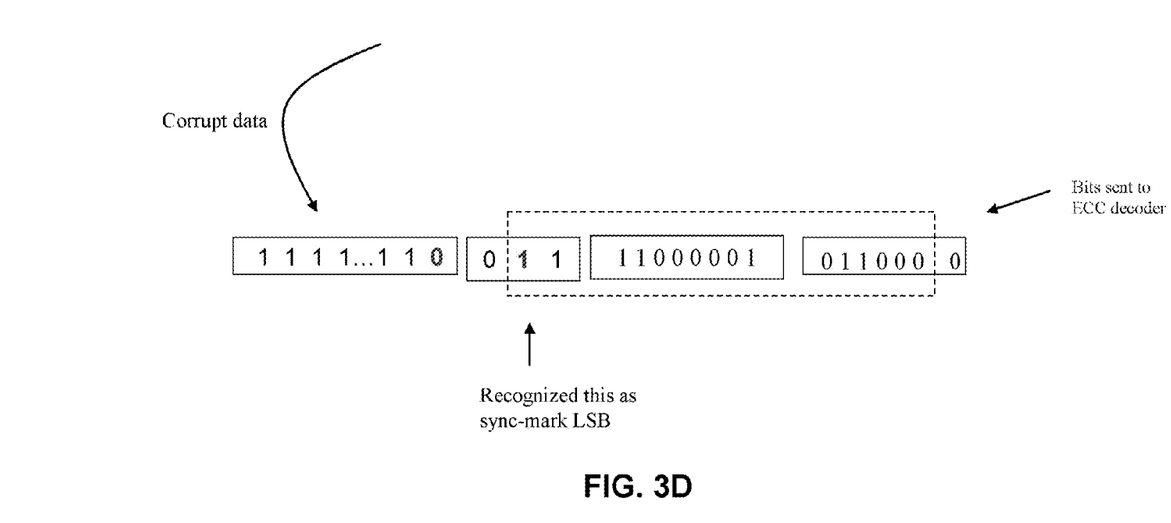
FIG. 3D illustrates an exemplary output of a syncmark and data detector in the receiver of FIG. 3A when the syncmark is mis-detected.

However, when the data is corrupted, the detector 3021 may find the syncmark at a wrong position, and send wrong bits to the ECC decoder 303. In the example shown in FIG. 3D, during the transmission, the last bit of the preamble may have changed from "1" to "0", and the second bit of the syncmark may have changed from "0" to "1". Since the syncmark and user data detector 302 may be informed in advance that the syncmark is "001", it may recognize the combination of the last bit of the preamble and the first two bits of the syncmark, which happens to be "001" because of the transmission error, as the received "syncmark". Accordingly, the "syncmark" is detected one bit earlier, but the syncmark and user data detector 302 may not realize the problem, and may send to the ECC decoder 303, as programmed, the LSB $\widehat{b}$ of the detected "syncmark" and the 15 bits thereafter for decoding. Thus, the input to the ECC decoder 303 may shift one bit to the left, and may include the last two bits of the detected "syncmark" "11", the detected "user data" "11000001" and the first six bits of the ECC parity 011000", as shown in FIG. 3D. Instead of decoding the corrupted data and spreading it, the ECC decoder 302 of the present invention may detect this type of error.

Figure 4:
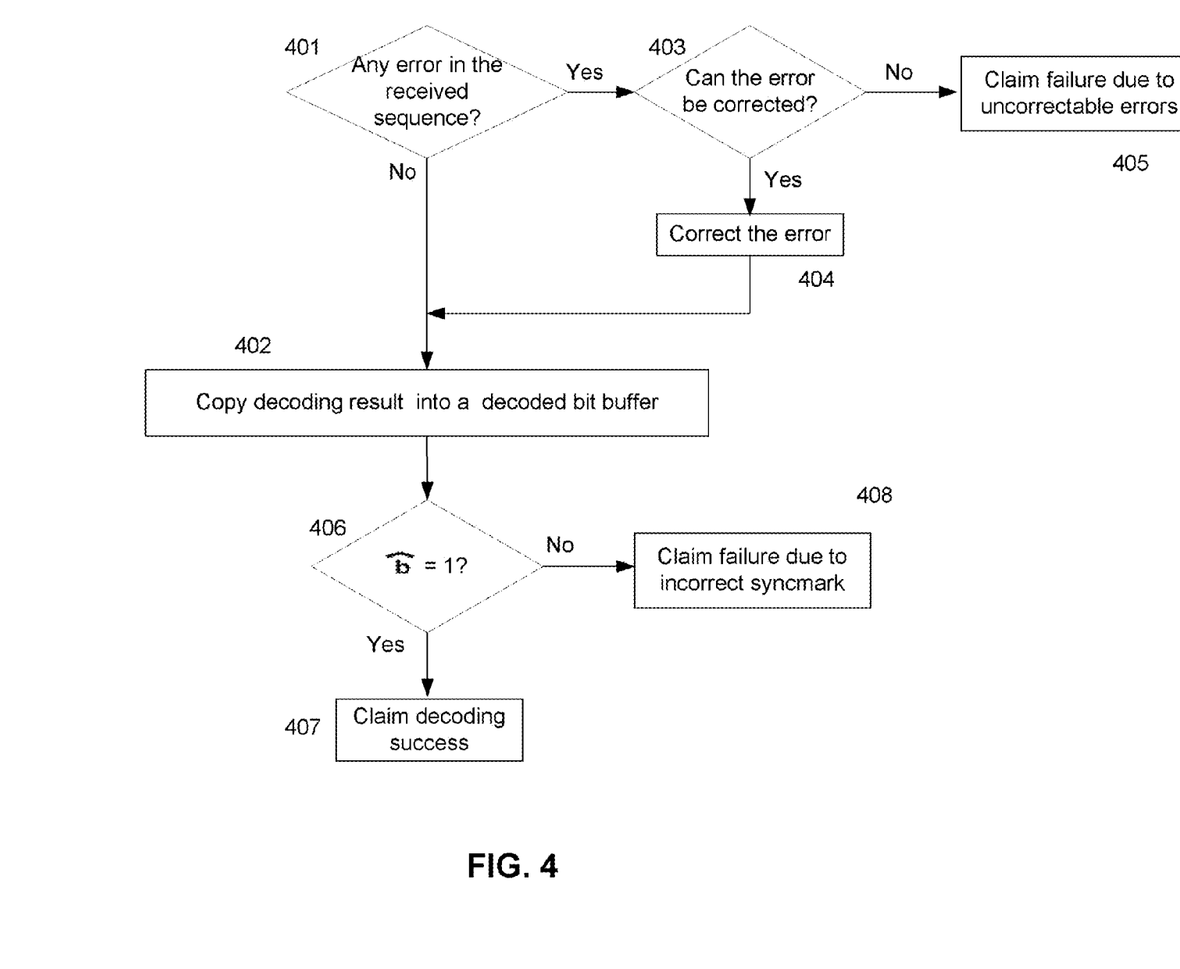
FIG. 4 illustrates a flowchart of the data processing in an ECC decoder in the receiver of FIG. 3A according to one embodiment of the present invention.

FIG. 4 illustrates the data processing in an ECC decoder according to one embodiment of the present invention.

At 401, the decoder 3031 may calculate syndromes and determine whether there is an error detected in the sequence received from the syncmark and user data detector 302, which may include the LSB $\widehat{b}$ of the syncmark and the 15 bits following it.

In one embodiment, the ECC is a cyclic code which adds parity to user data to form a code word. The decoder 3031 may calculate syndromes based on the sequence received from the syncmark and user data detector 302. If the received sequence is a valid code word and the syndromes are all zeros, the decoder 3031 may determine that no errors are detected.

If no error is detected, the received sequence may be copied to the decoded bit buffer 3032 at 402, and the procedure may proceed to 406.

If an error is detected, at 403, the decoder 3031 may determine whether the error can be corrected.

If the error can be corrected, at 404, the decoder 3031 may correct the error based on the syndromes obtained from 401. The procedure may then proceed to 402.

If a code can correct t bits of errors, each error pattern with an error number smaller or equal to t will be diagnosed by a distinct non-zero syndrome. Once such a syndrome is found by the decoder 3031, the corresponding error pattern will be corrected. All other non-zero syndromes correspond to uncorrectable error patterns and the zero syndrome corresponds to an error free valid codeword.

If there is an error in the sequence received from the syncmark and user data detector 302 and the error cannot be corrected, the decoder 3031 may claim failure due to uncorrectable errors in the input, and finish the processing for the input at 405.

In the data frame in FIG. 3D, since the data is corrupted, the syncmark and user data detector 302 found the syncmark at a wrong location, and sent out a data sequence 1111000001011000. This sequence is not the transmitted code word 1110000010110000 shown in FIG. 2. But the only difference between the data sequence from the syncmark and user data detector 302 (i.e., 1111000001011000) and the right cyclically shifted version of the transmitted code word (i.e., 0111000001011000), is that their first bits are different: "1" in the former and "0" in the latter. One property of a cyclic code is that the cyclic shift of a code word is still a code word, so the data sequence from the syncmark and user data detector 302 is still a code word for the decoder 3031 if the ECC is a cyclic code. The decoder 3031, which is a conventional ECC decoder, may not realize that there is an error in the data sequence from the syncmark and user data detector 302, and decode the data sequence. In one example, the decoder 3031 may select the most likely codeword as its decoding output. The received sequence and a valid codeword (shifted version of the transmitted code word) only differ by 1 bit, which is the smallest possible, thus the decoder may output 0111000001011000 as a decoding result, and copy the decoding result into the decoded bit buffer 3032. It can be seen that the decoding result is not the transmitted code word but a cyclically shifted version of it. The decoder 3031 may fail to detect the transmission error.

At 406, the decoder 3031 may check whether the bit in the decoding result corresponding to the syncmark LSB is "1", i.e., the value of the syncmark LSB of which the decoder 3031 was previously informed.

If yes, at 407, the decoder 3031 may claim decoding success, and output the bits corresponding to the user data in the decoded bits buffer 3032.

However, if the bit in the decoding result corresponding to the syncmark LSB is different from the syncmark LSB b, at 408, the decoder 3031 may claim decoding failure due to incorrect syncmark. For the sequence in FIG. 3D, since the first bit of the decoding result 0111000001011000 is "0", instead of "1", the value of the syncmark LSB, failure may be claimed at 408.

Steps 406-408 may add an additional safeguard by checking whether the bit in the decoding result from the decoder 3031 corresponding to the syncmark LSB is the same as the value of the syncmark LSB, and claiming decoding success only when they are the same. Consequently, transmission error in the sequence of FIG. 3D may be detected and the performance of the data transmission system may be improved.

In the embodiment shown in FIGS. 3A-3D and FIG. 4, the bit selected from the syncmark is "1". Sometimes, the bit selected from the syncmark may be "0", for example, when a correlation-based detector or a Viterbi (VTB) detector is used.

Figure 5:
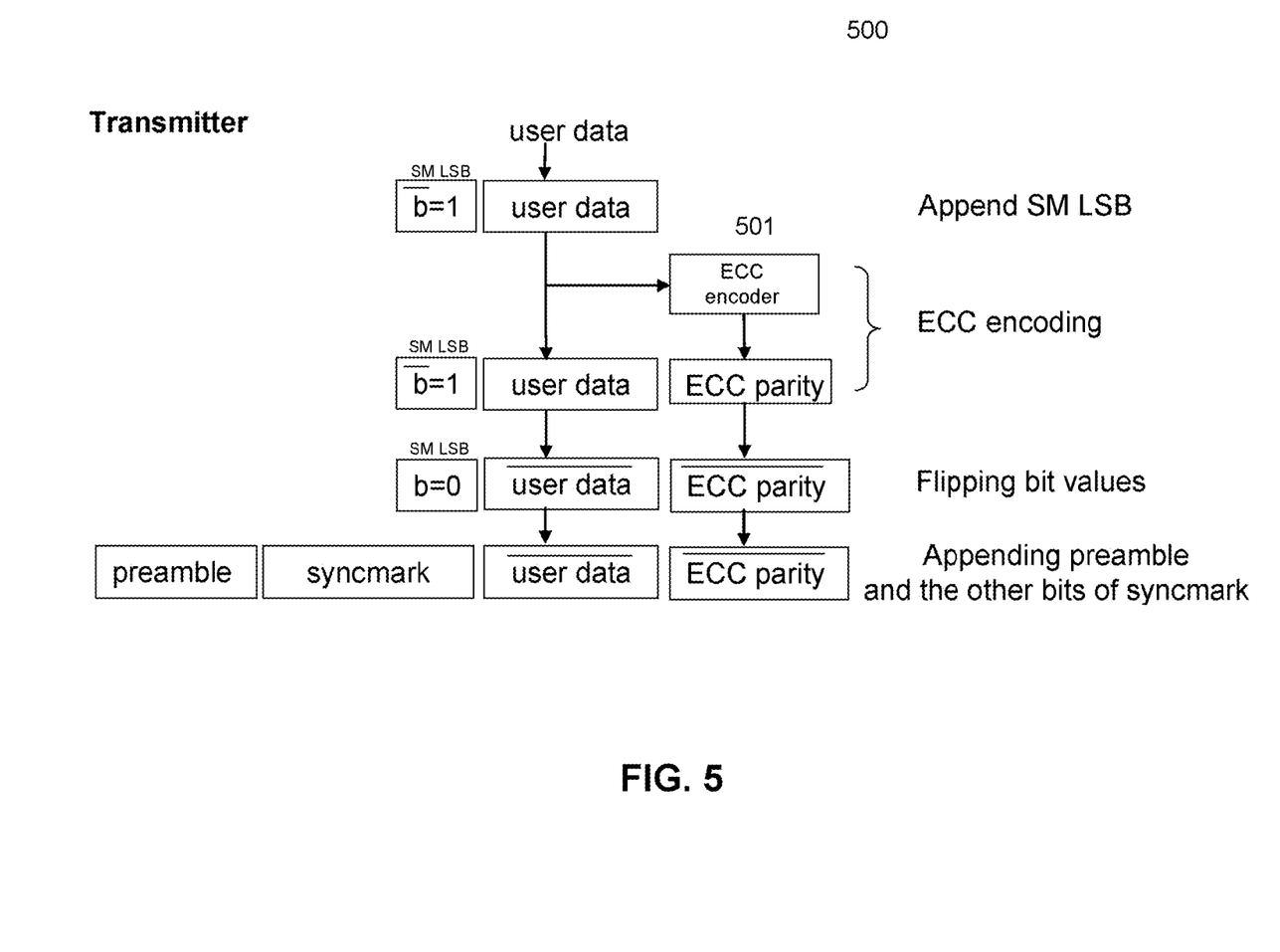
FIG. 5 illustrates a diagram of a transmitter according to one embodiment of the present invention.
Figure 6A:
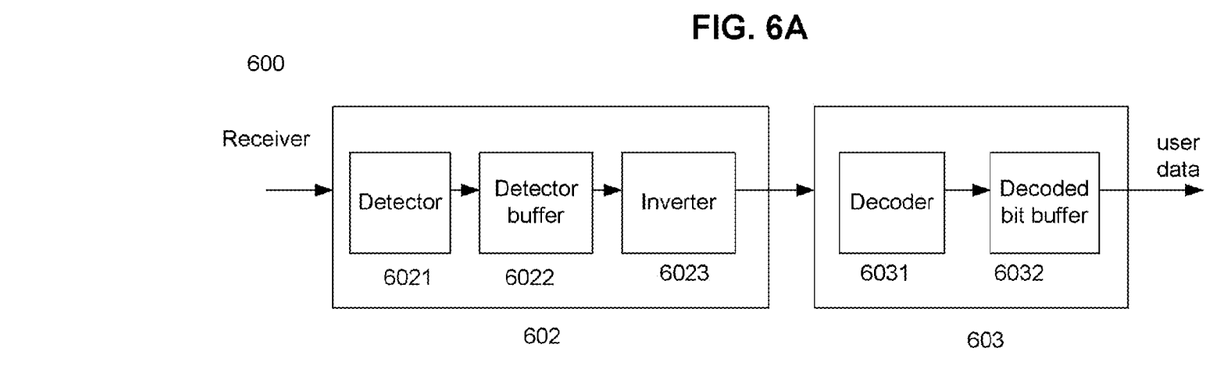
FIG. 6A illustrates a diagram of a receiver according to one embodiment of the present invention.
Figure 6B:
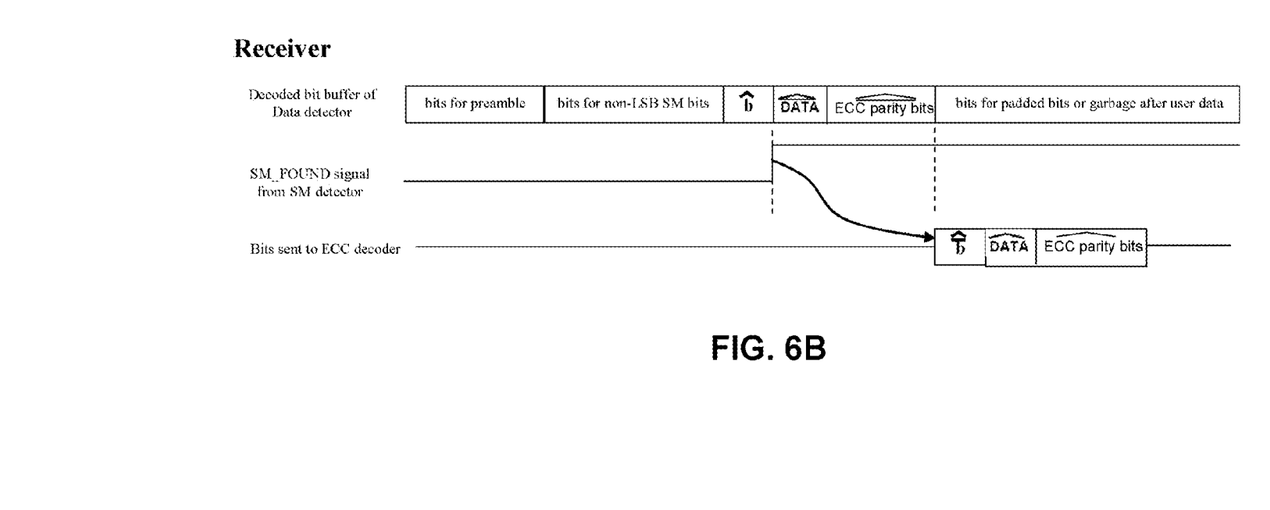
FIG. 6B illustrates exemplary data sequences in a syncmark and data detector in the receiver of FIG. 6A according to one embodiment of the present invention.

If the bit selected from the syncmark is "0", in one embodiment, it may be inverted to "1" and added to the input to an ECC encoder. The output of the ECC encoder may be inverted before transmitting the data frame. FIGS. 5 and 6 illustrate diagrams of a transmitter and a receiver in this scenario.

As shown in FIG. 5, when the bit selected from the syncmark is "0", it may be inverted to "1" and appended before the user data. The user data, with the inverted bit $\bar{b}$ from the syncmark, may be fed to an input of an ECC encoder 501 of a transmitter 500, and the ECC encoder 501 may generate an ECC parity for the input. The inverted bit from the syncmark $\bar{b}$, the user data and the parity may be inverted again, so that the bit from the syncmark is back to "0", its value in the syncmark. A data frame may be formed with the preamble, the syncmark, the inverted user data $\overline{DATA}$, and the inverted ECC parity $\overline{ECC\ parity}$.

FIG. 6A illustrates a diagram of a receiver according to one embodiment of the present invention. A receiver 600 may have a syncmark and user data detector 602 and an ECC decoder 603. The syncmark and user data detector 602 may include a detector 6021, a detector buffer 6022 and an inverter 6023, and the ECC decoder 603 may include a decoder 6031, and a decoded bit buffer 6032.

A data frame from the transmitter 500 may first enter the detector 6021 and the data start location may be detected by searching for the syncmark. If the detector 6021 determines that a syncmark is found, it may store the received data frame in the data detector buffer 6022. As shown in FIG. 6B, the stored data frame may have: the received preamble, the received syncmark (including the non-LSB bits and the LSB $\widehat{\bar{b}}$, the received inverted user data $\widehat{\overline{DATA}}$, the received inverted ECC parity $\widehat{\overline{ECC\ parity\ bits}}$, and padded bits or garbage after user data. A SM_FOUND signal may turn high right before the user data, indicating the start position of the received inverted user data. The received syncmark LSB $\widehat{\bar{b}}$, the received inverted user data $\widehat{\overline{DATA}}$, and the received inverted ECC parity $\widehat{\overline{ECC\ parity\ bits}}$ may be inverted again by the inverter 6023, so that the received inverted syncmark LSB $\widehat{\bar{b}}$, the received user data $\widehat{DATA}$, and the received ECC parity $\widehat{\overline{ECC\ parity\ bits}}$ may be fed to the ECC decoder 603 for decoding.

Figure 7:
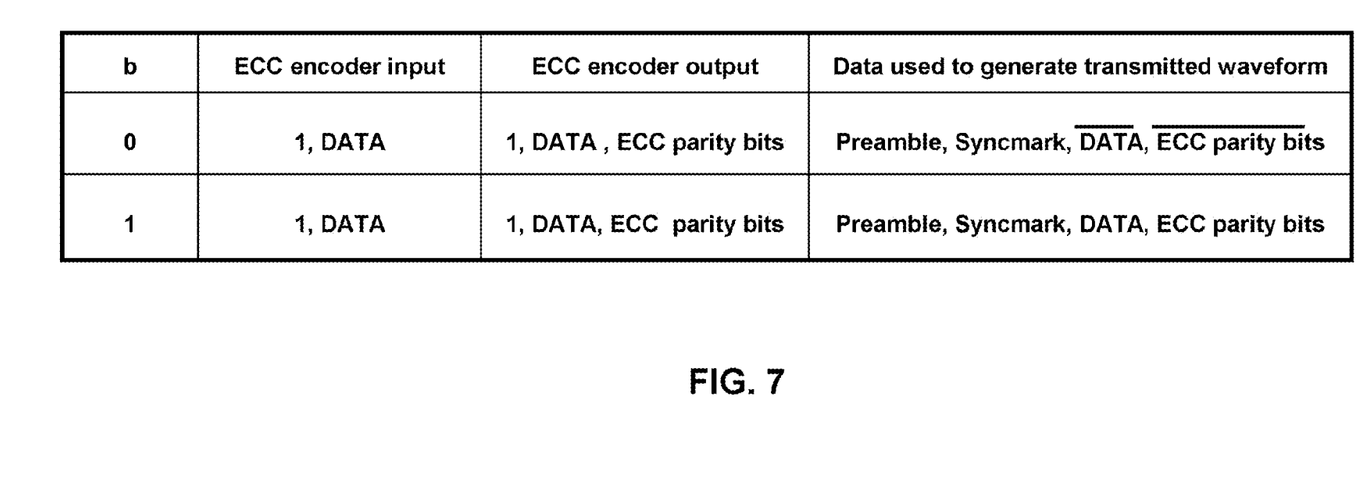
FIG. 7 illustrates a summary of the generation of data frames in a transmitter according to one embodiment of the present invention.

A summary of the generation of data frames in the transmitter is shown in FIG. 7. When the bit selected from the syncmark, b, is 1, the transmitter in FIG. 2 may be used. The input to the ECC encoder 201 may be 1 (the value of b) and user data. The output of the ECC encoder 201 may be 1 (the value of b), the user data and the ECC parity. The data frame for transmission may be the preamble, the syncmark, the user data, and the ECC parity. When the bit selected from the syncmark, b, is 0, the transmitter in FIG. 5 may be used. The input to the ECC encoder 501 may be 1 (the value of $\bar{b}$) and user data. The output of the ECC encoder 501 may be 1 (the value of $\bar{b}$), the user data and the ECC parity. The data frame for transmission may be the preamble, the syncmark, the inverted user data $\overline{DATA}$, and the inverted ECC parity $\overline{ECC\ parity}$.

Figure 8:
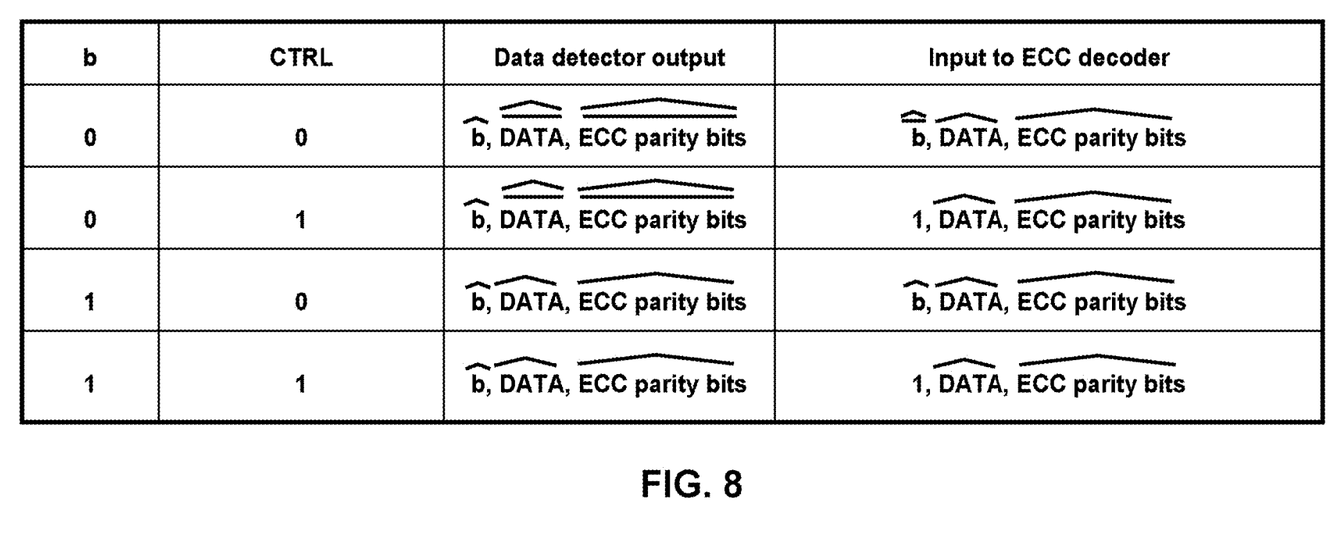
FIG. 8 illustrates a summary of the input to an ECC decoder according to one embodiment of the present invention.

Some ECC decoders may prefer that the value for the bit in the input to the ECC decoder corresponding to the syncmark LSB is 1. In one embodiment, a register bit CTRL may be used to force that bit to be 1. A summary of the input to the ECC decoder is shown in FIG. 8.

Specifically, when CTRL=1 and b=1, the receiver shown in FIG. 3A may be used. The sequence received from the syncmark and user data detector 302 may include the received syncmark LSB $\widehat{b}$, the received user data $\widehat{DATA}$, and the received ECC parity bits $\widehat{ECC\ parity\ bits}$. The bit in the input to the ECC decoder 303 corresponding to the syncmark LSB is forced to be 1, and the input to the ECC decoder 303 may include 1, $\widehat{DATA}$, and $\widehat{ECC\ parity\ bits}$. Since $\widehat{b}$ should be 1 in this scenario if there is no transmission error, transmission error may be filtered out. When CTRL=1 and b=0, the receiver shown in FIG. 6A may be used. The output of the detector 6021 may include the received syncmark LSB $\widehat{\bar{b}}$, the received inverted user data $\widehat{\overline{DATA}}$, and the received inverted ECC parity $\widehat{\overline{ECC\ parity\ bits}}$. The output of the detector 6021 may be inverted by the inverter 6023 before entering the ECC decoder 603 and become $\widehat{b}$, $\widehat{DATA}$, and $\widehat{ECC\ parity\ bits}$. The bit in the input to the ECC decoder 603 corresponding to the syncmark LSB may be forced to be 1, thus, the input to the ECC decoder may become 1, $\widehat{DATA}$, and $\widehat{ECC\ parity\ bits}$. Since $\widehat{b}$ should be 1 in this scenario if there is no transmission error, transmission error may be filtered out.

When CTRL=0 and b=1, the receiver in FIG. 3A may be used. The output of the syncmark and user data detector 302 may include the received syncmark LSB $\widehat{b}$, the received user data $\widehat{DATA}$, and the received ECC parity bits $\widehat{ECC\ parity\ bits}$; and the input to the ECC decoder 303 may include $\widehat{b}$, $\widehat{DATA}$, and $\widehat{ECC\ parity\ bits}$. When CTRL=0 and b=0, the receiver shown in FIG. 6A may be used. The output of the detector 6021 may include the received syncmark LSB $\widehat{\bar{b}}$, the received inverted user data $\widehat{\overline{DATA}}$, and the received inverted ECC parity $\widehat{\overline{ECC\ parity\ bits}}$. The output of the detector 6021 may be inverted by the inverter 6023 before entering the ECC decoder 603. Consequently, the input to the ECC decoder 603 may include the inversion of the received syncmark LSB $\hat{b}$, the received user data $\widehat{DATA}$, and the received ECC parity $\overline{ECC\ parity\ bits}$.

Figure 9:
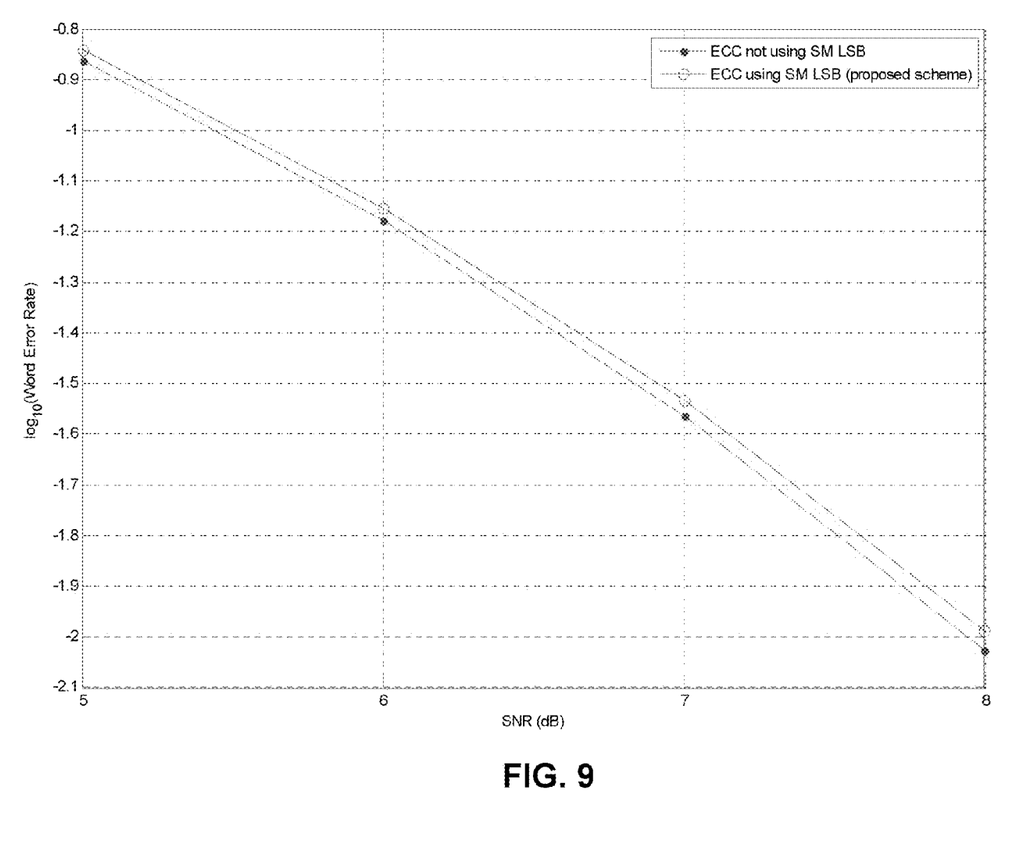
FIG. 9 illustrates a chart comparing error rates of an error detection method according to one embodiment of the present invention and a prior art method.
Figure 10:
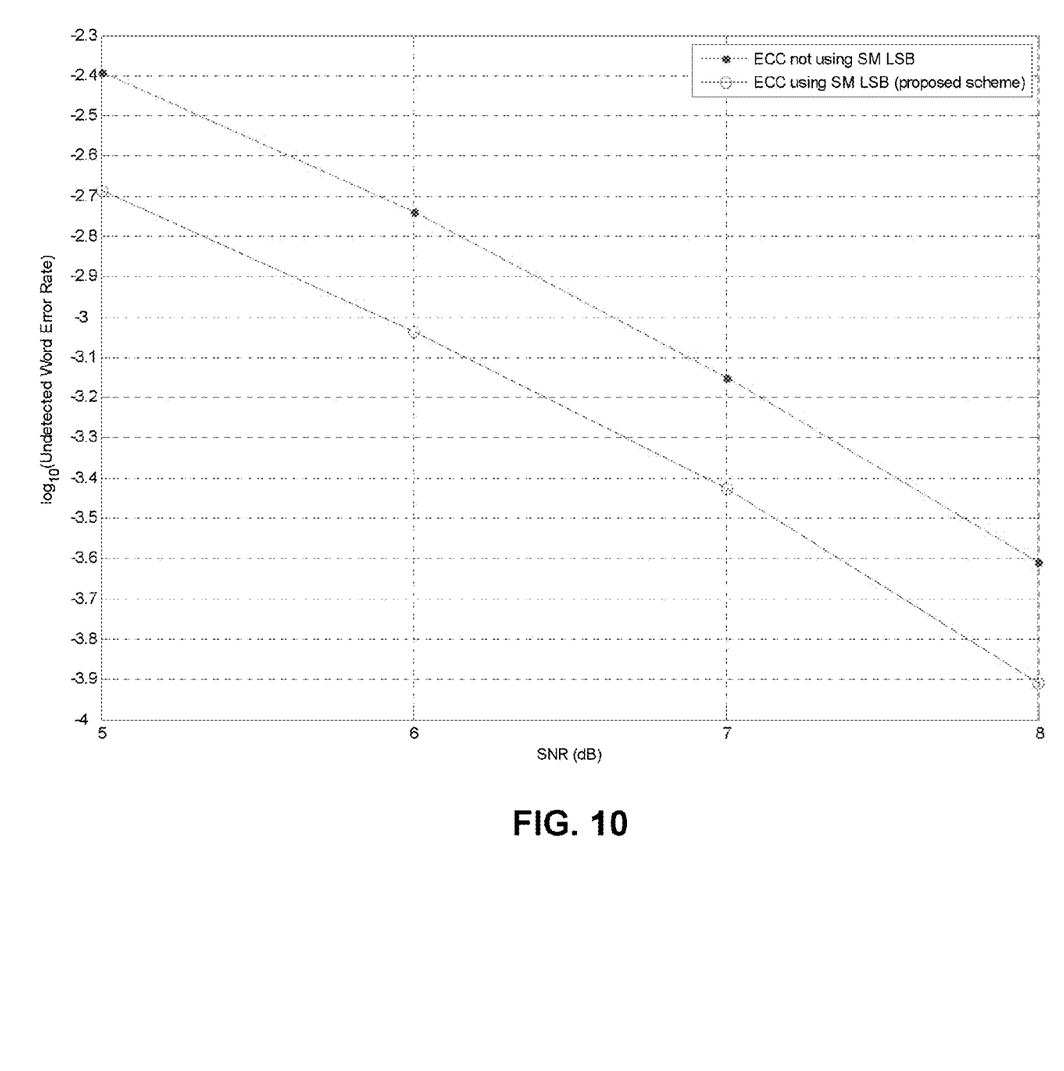
FIG. 10 illustrates a chart comparing error rates of an error detection method according to one embodiment of the present invention and a prior art method.

The invention may be used to improve the performance of repeated-run-out (RRO) data decoding, e.g., RRO data decoding in hard disk drives. FIGS. 9 and 10 compare error rates of embodiments of the present invention with those of the conventional systems. As shown in FIG. 9, the word error rate, i.e., the probability of not giving out correct RRO data, may be improved by about 0.025 dB. FIG. 10 indicates that undetected word error rate, i.e., the probability that wrong RRO data are given out but the code does not realize that they are wrong, may be improved by about 0.3 dB.

Several features and aspects of the present invention have been illustrated and described in detail with reference to particular embodiments by way of example only, and not by way of limitation. Alternative implementations and various modifications to the disclosed embodiments are within the scope and contemplation of the present disclosure. Therefore, it is intended that the invention be considered as limited only by the scope of the appended claims.

What is claimed is:

1. A method for detecting errors in data transmission, the method comprising:
at a transmitter:
generating an error correcting code (ECC) parity from (i) user data, and (ii) at least one bit from a syncmark;
forming a data frame with (i) the syncmark, (ii) the user data, and (iii) the ECC parity; and
transmitting the data frame; and
at a receiver:
receiving the data frame, wherein the received data frame includes (i) a received syncmark, (ii) received user data, and (iii) received ECC parity;
detecting the received syncmark in the received data frame;
selectively inverting a sequence, wherein the sequence includes (i) at least one bit from the received syncmark, (ii) the received user data, and (iii) the received ECC parity; and
decoding one of the sequence or the inverted sequence.

2. The method of claim 1, wherein the at least one bit from the syncmark is the least significant bit (LSB) of the syncmark.

3. The method of claim 1, wherein the data frame further comprises a preamble.

4. The method of claim 1, further comprising:
determining whether the at least one bit from the received syncmark is the same as a corresponding bit in the decoded sequence.

5. The method of claim 4, further comprising:
indicating decoding failure in response to the at least one bit from the received syncmark being different from the corresponding bit in the decoded sequence.

6. The method of claim 5, further comprising:
determining whether the received data frame has one or more errors.

7. The method of claim 6, further comprising:
in response to the received data frame having the one or more errors, determining whether the one or more errors are correctable.

8. The method of claim 7, further comprising:
indicating failure in response to at least one of the one or more errors being uncorrectable.

9. The method of claim 1, wherein in response to the at least one bit from the syncmark being zero, the ECC parity is generated from (i) the user data and (ii) an inversion of the at least one bit from the syncmark.

10. The method of claim 9, wherein the data frame comprises:
(i) the syncmark, (ii) an inversion of the user data, and (iii) an inversion of the ECC parity.

11. The method of claim 1, further comprising:
forcing the at least one bit from the received syncmark to be 1.

12. A transceiver comprising:
a transmitter comprising:
an ECC encoder configured to generate an ECC parity from (i) user data, and (ii) at least one bit from a syncmark; and
a data frame generator configured to generate a data frame for transmission from (i) the syncmark, (ii) the user data, and (iii) the ECC parity; and
a receiver comprising:
a detector configured to detect a received syncmark in a received data frame, wherein the received data frame includes (i) the received syncmark, (ii) received user data, and (iii) received ECC parity;
an inverter configured to selectively invert a sequence, wherein the sequence includes (i) at least one bit from the received syncmark, (ii) the received user data, and (iii) the received ECC parity; and
a decoder configured to decode one of the sequence or the inverted sequence.

13. The transceiver of claim 12, wherein the transmitter further comprises:
a first inverter configured to invert the at least one bit from the syncmark in response to the at least one bit from the syncmark being zero.

14. The transceiver of claim 13, wherein the transmitter further comprises:
a second inverter configured to selectively invert a transmission sequence, wherein the transmission sequence includes (i) the inverted at least one bit from the syncmark, (ii) the user data, and (iii) the ECC parity.

15. The transceiver of claim 12, wherein the receiver further comprises:
a first buffer configured to store an output of the detector in response to the received data frame having no errors.

16. The transceiver of claim 12, wherein the inverter is configured to invert the sequence in response to the at least one bit from the syncmark being zero.

17. The transceiver of claim 15, wherein the receiver further comprises:
a second buffer configured to store an output of the decoder.

* * * * *